United States Patent
Lee et al.

(10) Patent No.: US 7,307,017 B2
(45) Date of Patent: Dec. 11, 2007

(54) SEMICONDUCTOR DEVICES AND FABRICATION METHODS THEREOF

(75) Inventors: Han-Choon Lee, Seoul (KR); Jin-Woo Park, Yongin (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/852,823

(22) Filed: May 25, 2004

(65) Prior Publication Data

US 2005/0139934 A1 Jun. 30, 2005

(30) Foreign Application Priority Data

Dec. 31, 2003 (KR) ............ 10-2003-0101827

(51) Int. Cl.
*H01L 21/4763* (2006.01)
(52) U.S. Cl. .............. 438/649; 438/630; 438/655; 438/656; 257/E21.593
(58) Field of Classification Search ........ 438/630, 438/649, 655, 656; 257/E21.593
See application file for complete search history.

(56) References Cited

U.S. PATENT DOCUMENTS

| | | | | |
|---|---|---|---|---|
| 5,766,997 A | * | 6/1998 | Takeuchi | 438/257 |
| 5,830,775 A | * | 11/1998 | Maa et al. | 438/141 |
| 5,970,370 A | * | 10/1999 | Besser et al. | 438/586 |
| 6,225,197 B1 | * | 5/2001 | Maekawa | 438/487 |
| 6,383,880 B1 | * | 5/2002 | Ngo et al. | 438/303 |
| 6,586,333 B1 | | 7/2003 | Woo et al. | 438/682 |
| 2003/0186523 A1 | * | 10/2003 | Wieczorek et al. | 438/584 |
| 2004/0188240 A1 | * | 9/2004 | Chang et al. | 204/192.12 |
| 2004/0266150 A1 | * | 12/2004 | Sera | 438/530 |

* cited by examiner

*Primary Examiner*—George R. Fourson
*Assistant Examiner*—John M. Parker
(74) *Attorney, Agent, or Firm*—Andrew D. Fortney

(57) ABSTRACT

Semiconductor devices and methods of fabricating semiconductor devices are disclosed. A disclosed semiconductor device includes a silicon substrate, a source region and a drain region. A gate electrode is formed on the silicon substrate. Also, a metal silicide layer is formed on each of the gate electrode, the source region, and the drain region. The metal silicide layer has a thickness uniformity of about 1~20%. A disclosed fabrication method includes forming a metal layer on a silicon substrate having a gate electrode, a source region, and a drain region; performing a plasma treatment on the metal layer; forming a protective layer on the metal layer; and heat treating the silicon substrate on which the protective layer is formed to thereby form a metal silicide layer. A gas that includes nitrogen is used as a plasma gas during the plasma treatment.

19 Claims, 2 Drawing Sheets

SEMICONDUCTOR DEVICES AND FABRICATION METHODS THEREOF

FIELD OF THE DISCLOSURE

The present disclosure relates generally to semiconductor devices, and, more particularly, to semiconductor devices that include nickel silicide on select areas, and to methods of fabricating such semiconductor devices.

BACKGROUND

The performance of a transistor forming a semiconductor device is dependant on its speed, driving current, and leakage current. In an effort to improve the performance of the transistor, (that is, to increase its speed and to reduce its driving and leakage currents), much effort has been made to reduce the resistance of the source/drain regions and the resistance of the gate electrode. For example, a common method used in recent times to reduce these resistances is to form a metal silicide layer on an interfacial surface of the source/drain region and/or on an upper interfacial surface of the gate electrode.

Among the different types of metal suicides, nickel silicide is often used because of its particular advantages with respect to leakage current and level of resistance.

Conventional techniques using a nickel salicidation process are described in U.S. Pat. No. 6,383,880 and U.S. Pat. No. 6,586,333.

In a conventional method of forming a gate electrode using nickel silicide, nickel (Ni) is first deposited on a silicon substrate having a predetermined gate electrode and source/drain region. As a result, a nickel layer is formed on the interfacial surface of the source/drain region and on an upper interfacial surface of the gate electrode.

Next, a protective metal layer (e.g., a titanium layer or a titanium nitride layer) is formed on the nickel layer. These elements are then heat treated to induce a reaction between the nickel and the silicon, and to thereby form a nickel silicide layer.

However the above described conventional method has a serious flaw. In particular, as a result of the large reaction between the nickel and the silicon, the nickel silicide layer grows abnormally on part of the interfacial surface of the gate electrode and/or on part of the source/drain regions. That is, heat treating is performed at a high temperature of 300-600° C. At this high temperature, the nickel and silicon react too quickly on part of the interfacial surface and/or on part of the source/drain regions. This excessively quick reaction results in abnormal growth of the nickel silicide layer.

As a result of this abnormal growth, the nickel silicide layer has an uneven thickness. This uneven thickness ultimately causes an increase in the leakage current such that the characteristics and driving of the semiconductor device become unstable.

DETAILED DESCRIPTION

Figure 1:
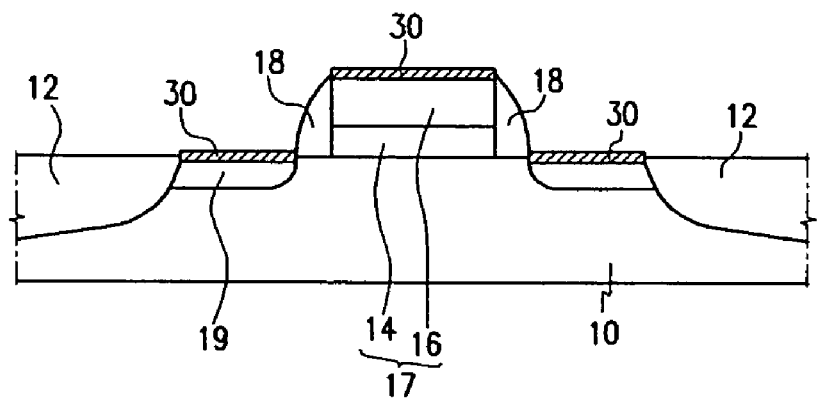
FIG. 1 is a cross-sectional view of an example semiconductor device constructed in accordance with the teachings of the present invention.

In the drawings, thicknesses of the various layers and regions have been enlarged for better illustration of their shapes and interrelations. Thus, the drawings are not to be taken as dimensionally accurate. Further, like reference numerals will be used for identical elements in all of the following description and drawings. Finally, when it is stated that an element is "above", "on", etc. another element, the two referenced elements may be directly adjacent to one another (i.e., without an element interposed therebetween), or the two referenced elements may have one or more element(s) interposed therebetween. However, if it is stated that an element is present "directly above", "directly on", etc. another element, there is no element interposed between these two elements.

FIG. 1 is a cross-sectional view of an example semiconductor device. The illustrated device includes a silicon substrate 10. A device isolation region 12 is formed in the silicon substrate 10. The device isolation region 12 defines an active region. A gate oxidation layer 14 is formed on a portion of the active region. A gate electrode layer 16, (for example, polycrystalline silicon) is formed on the gate oxidation layer 14, thereby completing a gate 17.

A spacer 18 made of an insulation material is formed along the side walls of the gate electrode layer 16 and the gate oxidation layer 14. Source and drain regions 19 are formed on opposite sides of the gate electrode layer 16 and the spacer 18. The source and drain regions 19 are doped at a high concentration with n-type or p-type impurities.

One or more silicide layers 30 are formed on the gate electrode layer 16, and on the source and drain regions 19. In the illustrated example, the silicide layers 30 include nitrogen to decrease the rate at which they grow. Therefore, the silicide layers 30 are prevented from undergoing abnormal growth. In particular, the nitrogen in the silicide layers 30 acts such that a thickness of the silicide layers 30 is within a range of about 100~400 Å, and the thickness uniformity of the silicide layers 30 is about 1~20%.

Further, the nitrogen prevents the silicide layers 30 from excessively permeating the elements of the silicon substrate 10. In an example, a lower surface of the silicide layers 30 contacting the silicon substrate 10 permeates the silicon substrate 10 to a depth of less than about 400 Å. The silicide layers 30 may be made of nickel (Ni). The thickness of the nickel silicide layers 30 may be about 100~400 Å.

When the silicide layers 30 as described above are contacted to wiring made of metal or polysilicon, the contact resistance of the interfacial surfaces is reduced.

A method of fabricating the semiconductor device described above will now be described. In particular, FIGS. 2a-2d are cross-sectional views illustrating sequential processes of an example fabrication method.

In the illustrated example, a nickel layer is used as an example of a metal layer.

Figure 2A:
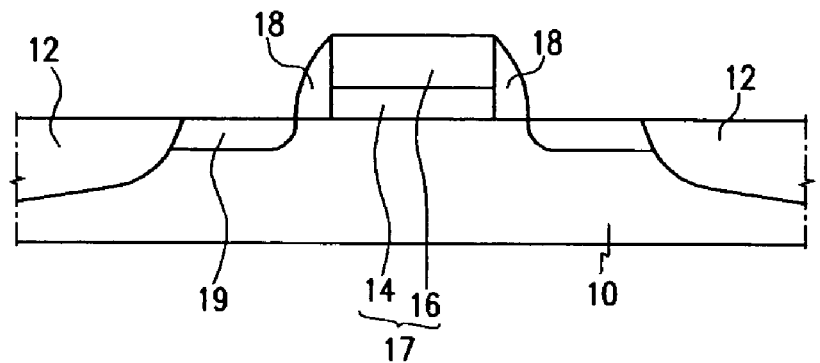
FIGS. 2a-2d are cross-sectional views sequentially illustrating an example method of fabricating a semiconductor device in accordance with the teachings of the present invention.

Referring first to FIG. 2a, a device isolation region 12 is formed in a silicon substrate 10 to define an active region. Next, an oxidation layer and a polysilicon layer are sequentially formed on the silicon substrate 10. The polysilicon layer and the oxidation layer then undergo photolithography by using a mask to sequentially pattern the polysilicon layer and the oxidation layer. As a result, a gate 17 comprising a gate electrode layer 16 and a gate oxidation layer 14 is formed on an exposed surface of the active region.

Next, silicon nitride (SiN$_x$) is deposited on the silicon substrate 10. The silicon nitride covers the gate 17 to thereby form a nitrate layer. An etch back process is then performed on the nitrate layer such that spacers 18 are formed on the side walls of the gate 17.

Subsequently, an oxidation layer is formed over the entire surface of the silicon substrate 10. The oxidation layer is then patterned to form a cap oxidation layer (not shown) to protect the gate 17. While using the cap oxidation layer as a mask, conductive impurity ions are doped into the active region to thereby form a source region 19 and a drain region 19. The injected ions may be n-type or p-type impurities such as phosphorus (P) and boron (B).

Although in the above, only the source region 19 and the drain region 19 were formed, an LDD region (not shown) may also be formed prior to the formation of the spacer 18.

Figure 2B:
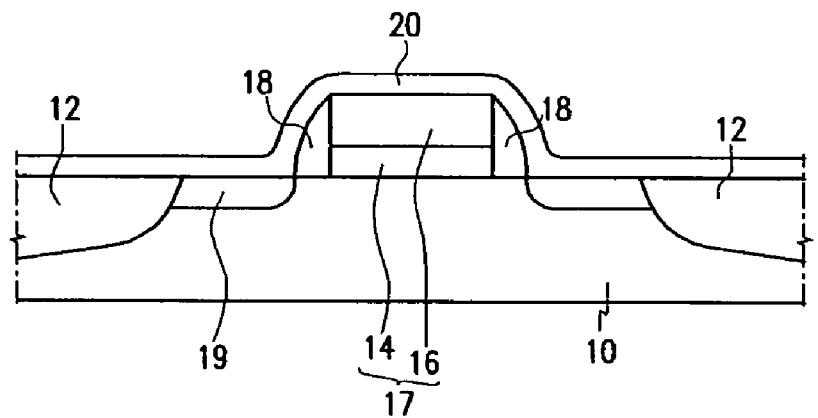

Next, with reference to FIG. 2b, nickel (Ni), for example, is deposited over the entire surface of the silicon substrate 10 to thereby form a nickel layer 20 for silicide use. The nickel layer 20 is typically formed using PVD (physical vapor deposition) or CVD (chemical vapor deposition).

Figure 2C:
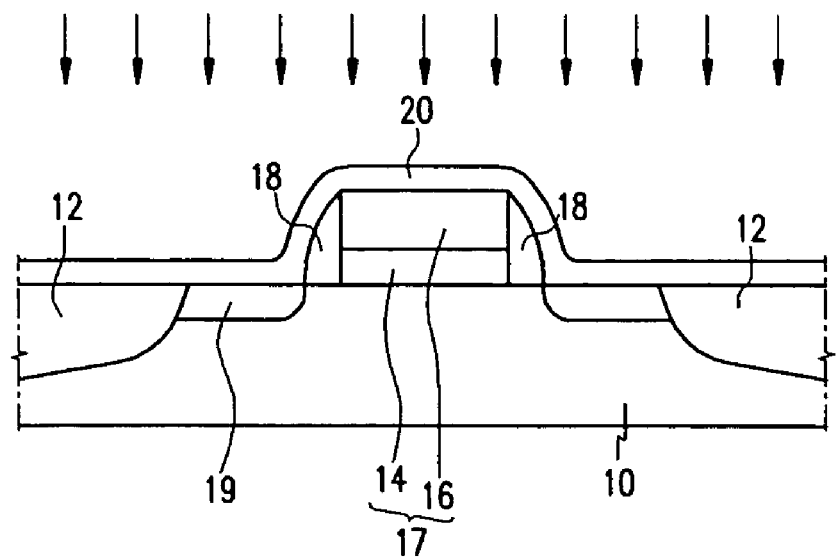

Referring to FIG. 2c, a plasma treatment is then performed on the nickel layer 20 using a gas that contains nitrogen. In an example, $N_2$ gas or $NH_3$ gas is used as the gas that contains nitrogen. Further, in the illustrated example, the plasma treatment is performed in-situ in the same chamber used to form the nickel layer 20.

Nitrogen is injected into the nickel layer 20 through the plasma treatment. The nitrogen reduces the speed at which a metal silicide layer (described below) is grown. Therefore, the gas that contains nitrogen slows the reaction rate between the nickel and the silicon when the nickel layer 20 and the silicon are reacted in a subsequent silicide process used to form a nickel silicide layer.

Figure 2D:
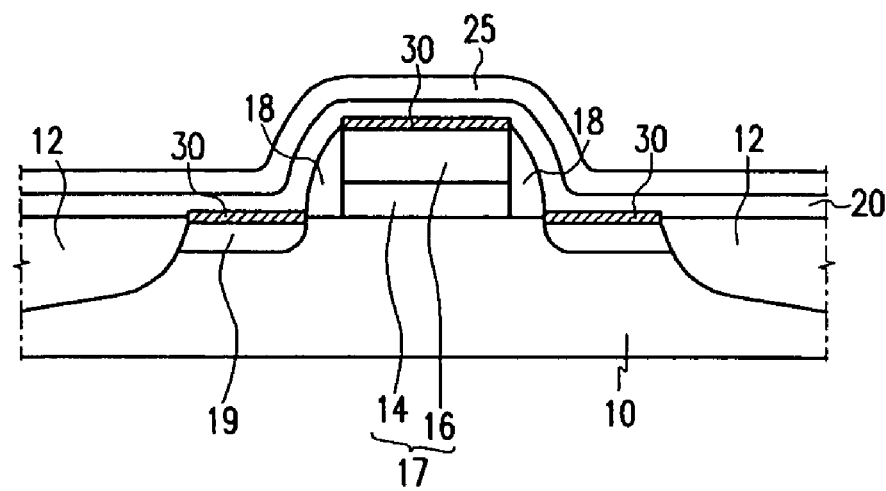

Subsequently, with reference to FIG. 2d, a protective layer 25 for protecting the nickel layer 20 is formed on the nickel layer 20. The protective layer 25 is formed by performing a PVD or CVD process with Ti, TiN, or a compound such as Ti/TiN.

Next, a first heat treatment process is performed to form a nickel silicide layer 30 on the gate electrode layer 16, the source region 19, and the drain region 19. In an example, the first heat treatment process is performed in a gas atmosphere (i.e., an $N_2$ or $NH_3$ gas atmosphere).

During the formation of the nickel silicide layer 30, nickel atoms are sufficiently accumulated on the upper interfacial surfaces of the source/drain regions 19 and the gate electrode layer 16 even if a natural oxidation layer is present on these elements. Therefore, such a natural oxidation layer does not impede the formation of the nickel silicide layer 30.

The first heat treatment process may be performed using an RTP method or the more common method that utilizes an electric furnace. In an example when the RTP method is used, a temperature of about 300-600° C. is maintained for about 10-60 seconds. In another example when an electric furnace is used, the process is performed at a temperature of about 300-600° C. for about 20-60 seconds.

Through the use of the above method, a metal silicide layer 30 is formed having a thickness uniformity of about 1~20%, to a thickness of about 100~400 Å, and to a depth of less than about 400 Å within the silicon substrate 10.

Forming the nickel layer 20, performing the plasma treatment, forming the protective layer 25, and performing the heat treatment process may be performed in situ in the same vacuum chamber. This reduces the manufacturing time.

Next, the nickel layer 20 and the protection layer 25 are removed. This removal is accomplished by etching the silicon substrate 10 using an SPM solution at about 50-150° C. for about 5-15 minutes. Also, cleaning is performed for about 3-10 minutes in an SC1 solution to remove impurities generated during etching. An example SPM solution may be realized by using hydrogen peroxide and sulfuric acid at a ratio of 1:6.

A second heat treatment process is performed following the above processes to stabilize the nickel silicide layer 30. In an example when the RTP method is used, a temperature of about 800-950° C. is maintained for about 10-60 seconds. In another example, when an electric furnace is used, the process is performed at a temperature of about 500-900° C. for about 20-60 seconds.

In the examples described above, the reaction rate between the nickel and the silicon is slowed to thereby prevent abnormal growth of nickel silicide. Therefore, the interfacial contact resistance and the leakage current of the source/drain regions 19 and of the gate electrode 17 of a transistor may be reduced, thereby stabilizing the semiconductor device characteristics and the driving of the same.

From the foregoing, persons of ordinary skill in the art will appreciate that a semiconductor device that does not exhibit abnormal growth of nickel silicide and, thus, has a nickel silicide layer of a uniform thickness has been disclosed.

In an illustrated example, the semiconductor device includes a silicon substrate 10 having a source region 19 and a drain region 19; a gate electrode 17 formed on the silicon substrate 10; and a metal silicide layer 30 formed on each of the gate electrode 17, the source region 19, and the drain region 19, and having a thickness uniformity of about 1~20%.

In an example, each of the metal silicide layers 30 is a nickel silicide layer having a thickness of about 100~400 Å. Each of the metal silicide layers 30 includes nitrogen to reduce the speed at which the metal silicide layers 30 grow. The metal silicide layers 30 are formed to a depth of less than about 400 Å within the silicon substrate 10.

An example fabrication method disclosed herein includes: (a) forming a metal layer on a silicon substrate 10 having a gate electrode 17, a source region 19, and a drain region 19; (b) performing a plasma treatment on the metal layer; (c) forming a protective layer on the metal layer that has undergone the plasma treatment; and (d) heat treating the silicon substrate on which the protection layer is formed to thereby form a metal silicide layer 30. A gas that includes nitrogen is used as a plasma gas during the plasma treatment.

In an example, the metal layer 30 is formed using nickel and one of PVD and CVD.

In an example, the plasma treatment is performed in-situ in the same chamber used to form the metal layer.

The nitrogen, which reduces the speed at which the metal silicide layer 30 grows, is injected into the metal layer through the plasma treatment.

In an example, forming a metal layer 20, performing a plasma treatment, forming a protective layer 25, and heat treating the silicon substrate 10 are all performed in the same chamber.

One of titanium, titanium nitride, and a titanium/titanium nitride compound is used to form the protective layer.

One of PVD and CVD is used to form the protective layer.

In forming a metal layer, the thickness uniformity is about 1~20%, the thickness is about 100~400 Å, and the metal layer enters a surface of the silicon substrate 10 to a depth of less than about 400 Å.

In heat treating the silicon substrate 10, one of an RTP method and an electric furnace is used. In the RTP method, a temperature of about 300-600° C. is maintained for about 10-60 seconds. In the electric method, a temperature of about 300-600° C. is maintained for about 20-60 seconds.

The illustrated example further includes removing the protective layer 25 and the metal layer that has not been formed into the silicide layer 30 following the formation of the metal silicide layer 30.

In the illustrated example, a second heat treating process following the removing of the metal layer is employed. In the second heat treating process, one of an RTP method and an electric furnace is used. A temperature of about 900-950° C. is maintained for about 10-60 seconds in the RTP method, and a temperature of about 500-900° C. is maintained for about 20-60 seconds in the method utilizing an electric furnace.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a semiconductor device, comprising:
   forming a metal layer on a silicon substrate having a gate electrode, a source region, and a drain region;
   performing a plasma treatment with a gas comprising nitrogen on the metal layer, wherein nitrogen is added to metal layer;
   forming a protective layer on the metal layer; and
   heat treating the silicon substrate having the protective layer to thereby form a metal silicide layer containing nitrogen and having a thickness of about 100~400 Å and a thickness uniformity of about 1~20%.

2. A method as defined in claim 1, wherein to gas comprising nitrogen comprises one of $N_2$ gas and NH3 gas.

3. A method as defined in claim 1, wherein forming the metal layer comprises depositing a nickel layer.

4. A method as defined in claim 3, wherein depositing a nickel layer comprises a PVD process or a CVD process.

5. A method us defined in claim 1, wherein the plasma treatment is performed in-situ in a same chamber used to form the metal layer.

6. A method as defined in claim 1, wherein the nitrogen, which reduces a speed at which the metal silicide layer grows, is injected into the metal layer trough the plasma treatment.

7. A method as defined in claim 1, wherein forming the metal layer, performing the plasma treatment, forming the protective layer, and heat treating the silicon substrate are all performed in a same chamber.

8. A method as defined in claim 1, wherein forming the protective layer comprises depositing titanium, titanium nitride, or titanium/titanium nitride.

9. A method as defined in claim 8, wherein forming the protective layer comprises physical vapor deposition (PVD) or chemical vapor deposition (CVD).

10. A method as defined in claim 1, wherein heat treating the silicon substrate comprises a first RTP method or heating in an electric furnace.

11. A method as defined in claim 1, further comprising removing the protective layer and an unreacted portion of the metal layer following the formation of the metal silicide layer.

12. A method as defined in claim 11, further comprising a second beat treating process following removing the protective layer and the unreacted portion of the metal layer.

13. A method as defined in claim 12, wherein in the second heat treating process comprises a second RTP method or beating in the electric furnace.

14. A method as defined in claim 1, wherein the metal silicide layer enters a surface of the silicon substrate to a depth of less than about 400 Å.

15. A method as defined in claim 10, wherein the first RTP method comprises exposure to a temperature of about 300-600° C. for about 10-60 seconds.

16. A method as defined in claim 10, wherein heating in an the electric furnace comprises exposure to a temperature of about 300-600° C. for about 20-60 seconds.

17. A method as defined in claim 13, wherein the second RTP method comprises exposure to a temperature of about 900-950° C. for about 10-60 seconds.

18. A method as defined in claim 13, wherein heating in the electric furnace comprises exposure to a temperature of about 500-900° C. for about 20-60 seconds.

19. A method as defined in claim 1, further comprising forming nitride spacers on sidewalls of the gate electrode prior to forming the metal layer.

* * * * *